(12) United States Patent
Naughton et al.

(10) Patent No.: US 7,776,677 B1
(45) Date of Patent: Aug. 17, 2010

(54) METHOD OF FORMING AN EEPROM DEVICE AND STRUCTURE THEREFOR

(75) Inventors: John J. Naughton, Idaho Falls, ID (US); Matthew Tyler, Kaysville, UT (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 12/414,071

(22) Filed: Mar. 30, 2009

(51) Int. Cl.
*H01L 21/8238* (2006.01)
(52) U.S. Cl. .............. 438/201; 438/211; 257/E21.179; 257/E21.422; 257/E21.68
(58) Field of Classification Search ................ 438/201, 438/211, 257, 593; 257/E21.179, E21.422, 257/E21.68
See application file for complete search history.

(56) References Cited

U.S. PATENT DOCUMENTS

| | | | |
|---|---|---|---|
| 4,649,520 A | 3/1987 | Eitan | |
| 5,763,912 A | 6/1998 | Parat et al. | |
| 6,627,947 B1 | 9/2003 | Hu et al. | |
| 7,190,020 B2 | 3/2007 | Forbes et al. | |
| 7,247,917 B2 * | 7/2007 | Choi | ............ 257/401 |
| 7,336,535 B2 | 2/2008 | Kuroda et al. | |
| 7,355,237 B2 | 4/2008 | Lutze et al. | |
| 7,361,530 B2 | 4/2008 | Terasawa et al. | |

FOREIGN PATENT DOCUMENTS

JP 2007-263681 10/2007

* cited by examiner

*Primary Examiner*—Hoai V Pham
(74) *Attorney, Agent, or Firm*—Robert F. Hightower

(57) ABSTRACT

In one embodiment, an EEPROM device is formed to include a metal layer having an opening therethrough. The opening overlies a portion of a floating gate of the EEPROM device.

13 Claims, 3 Drawing Sheets

METHOD OF FORMING AN EEPROM DEVICE AND STRUCTURE THEREFOR

BACKGROUND OF THE INVENTION

The present invention relates, in general, to electronics, and more particularly, to semiconductors, structures thereof, and methods of forming semiconductor devices.

In the past, the semiconductor industry utilized various methods and structures to produce electrically erasable programmable read only memory (EEPROM) devices that the included a plurality of EEPROM cells. One typical EEPROM cell is described in U.S. Pat. No. 7,190,020 that issued to Forbes et al. on Mar. 13, 2007. During the process of forming the EEPROM devices, it was possible for the transistors within each EEPROM cell to have mismatched threshold voltages which resulted in improper operation of the EEPROM cell.

Accordingly, it is desirable to have an EEPROM cell that has transistors with more closely matched threshold voltages, and to have a structure that assists in forming the transistors with more closely matched threshold voltages.

Figure 1:
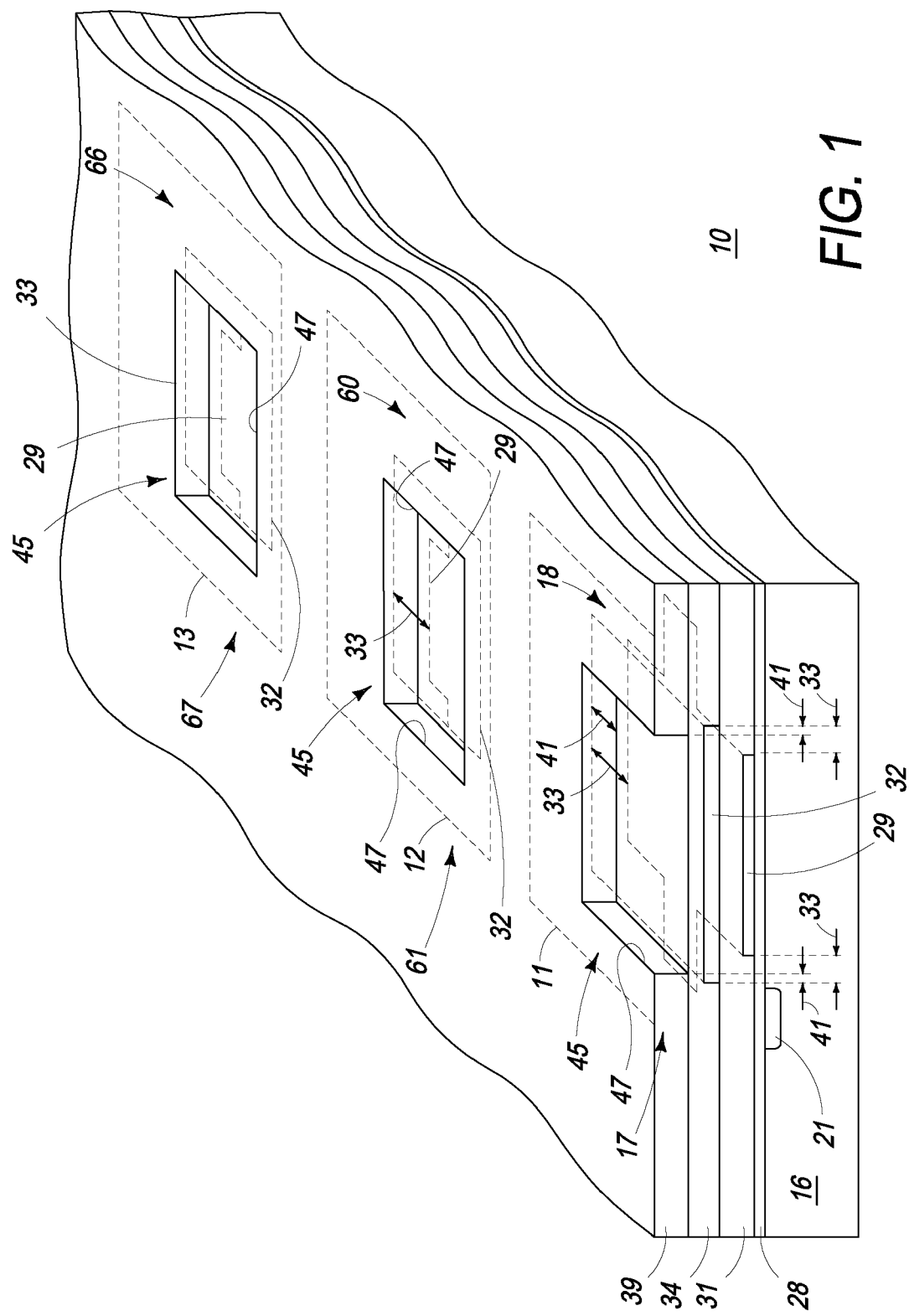
FIG. 1 illustrates a cross-sectional isometric view of a portion of an embodiment of an EEPROM device that includes a plurality of EEPROM cells in accordance with the present invention.

For simplicity and clarity of the illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, or certain N-type or P-type doped regions, a person of ordinary skill in the art will appreciate that complementary devices are also possible in accordance with the present invention. It will be appreciated by those skilled in the art that the words during, while, and when as used herein relating to circuit operation are not exact terms that mean an action takes place instantly upon an initiating action but that there may be some small but reasonable delay, such as a propagation delay, between the reaction that is initiated by the initial action. The use of the word approximately or substantially means that a value of an element has a parameter that is expected to be very close to a stated value or position. However, as is well known in the art there are always minor variances that prevent the values or positions from being exactly as stated. It is well established in the art that variances of up to at least ten percent (10%) (and up to twenty percent (20%) for semiconductor doping concentrations) are reasonable variances from the ideal goal of exactly as described. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

DETAILED DESCRIPTION OF THE DRAWING

FIG. 1 illustrates a cross-sectional isometric view of a portion of an embodiment of an EEPROM device 10 that includes a plurality of EEPROM cells including EEPROM cells 11, 12, and 13. Cells 11, 12, and 13 are identified in a general manner by dashed boxes. Device 10 and cells 11, 12, and 13 are formed on a semiconductor substrate 16. In the preferred embodiment, substrate 16 has a P-type conductivity. Also in the preferred embodiment, each of cells 11, 12, in 13 are a differential memory cell that includes read-out transistors 17 and 18 (as will be seen further hereinafter). The differential structure of cells 11, 12, and 13 minimizes sensitivity to electric field disturbances. As will be understood by those skilled in the art, an EEPROM device such as device 10 typically includes more EEPROM cells than the three cells illustrated in FIG. 1.

The following descriptions refer to cell 11 and the elements associated therewith. Those skilled in the art will appreciate that the description is also applicable to cells 12 and 13.

Figure 2:
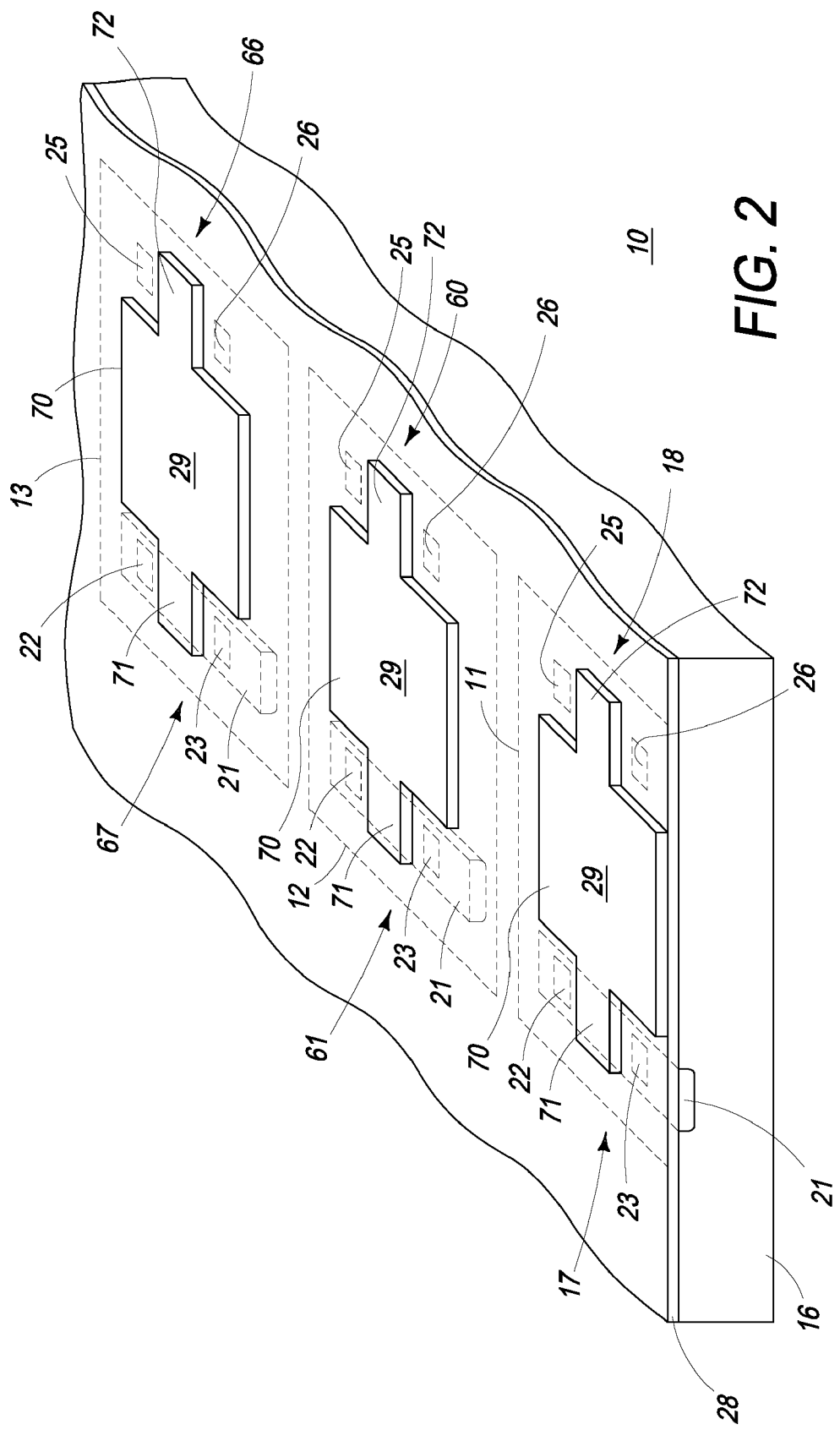
FIG. 2 illustrates the EEPROM device of FIG. 1 at a stage in an embodiment of a method of forming the EEPROM device of FIG. 1.

FIG. 2 illustrates a cross-sectional isometric view of a portion of an embodiment of device 10 at a stage in an embodiment of a method of forming device 10. This description has references to FIG. 1 and FIG. 2. In the preferred embodiment, transistor 17 is formed as a P-channel MOS transistor and transistor 18 is formed as an N-channel MOS transistor. Because the preferred embodiment of substrate 16 is a P-type conductivity, an N-type doped region 21 is formed on the surface of substrate 16 and P-type doped regions 22 and 23 are formed within region 21 to form respective source and drain regions of transistor 17. Region 23 and is spaced apart from region 22 so that a portion of region 21 is between regions 22 and 23 becomes a channel region for transistor 17. N-type regions 25 and 26 are formed on the surface of substrate 16 and spaced a distance apart from region 21 in order to form respective drain and source regions of transistor 18. Region 25 is spaced apart from region 26 so that a portion of substrate 16 is between regions 25 and 26 becomes a channel region for transistor 18. Those skilled in the art will appreciate that the source and drain regions of transistor 17 may be reversed, and the same applies for transistor 18.

A gate dielectric 28 is formed overlying the portion of transistors 17 and 18 where the channel region is to be formed. In one embodiment, dielectric 28 is formed overlying all of substrate 16 where cells 11, 12, and 13 are to be formed. In other embodiments, dielectric 28 may be patterned to position dielectric 28 only within cells 11-13. Dielectric 28 generally is formed from silicon dioxide.

A floating gate 29 is formed within each of cells 11-13 and overlying dielectric 28. Gate 29 usually includes three sections, a bit storage section 70, a gate electrode 71 for one transistor, such as electrodes for transistors 17, 61, and 67, and another gate electrode 72 for another transistor, such as electrodes each of transistors 18, 60, and 66. Gate electrodes 71 and 72 extend from bit storage section 70 to overlie the channel region of the respective transistor. For transistor 17 for example, gate electrode 71 extends to overlie the channel region of transistor 17. Floating gate 29 generally is formed by applying a layer of doped polysilicon on the surface of dielectric 28 and patterning the doped polysilicon.

Figure 3:
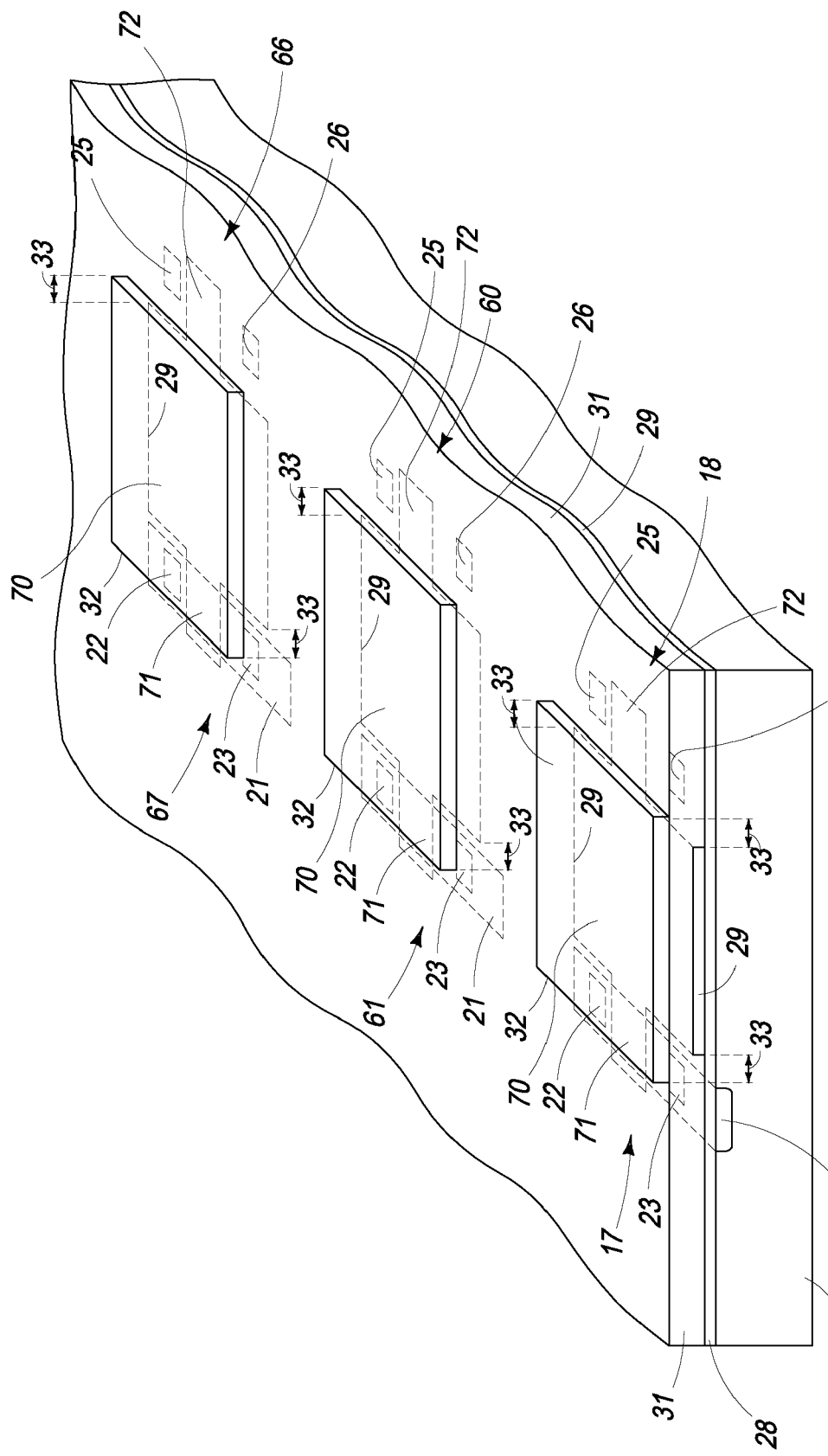
FIG. 3 illustrates the EEPROM device of FIG. 2 at a subsequent stage in an embodiment of a method of forming the EEPROM device.

FIG. 3 illustrates device 10 at a subsequent stage in an embodiment of a method of forming device 10. Subsequently, a dielectric layer 31 generally is formed on gate 29 and overlying transistors 17 and 18 to provide insulation from other elements of device 10. Gate 29, region 21, and regions 22, 23, 25, and 26 are illustrated in FIG. 3 as dashed lines to illustrate that are underlying layer 31, thus, are hidden in the view illustrated in FIG. 3. In some embodiments, a conductor interconnect layer (not shown) may be formed on layer 31 to electrically connect to regions 22, 23, 25, or 26. This conductor layer is generally formed form a metal and is often referred to as a first interconnect layer or sometimes as metal one (1). The first interconnect layer can assist in forming an electrical connection to the source or drain of transistors 17 and 18.

A control gate 32 is formed to overlie at least a portion of floating gate 29. Typically, control gate 32 is formed by applying a layer of doped polysilicon on the surface of layer 31 and patterning the doped polysilicon. Control gate 32 has one outer edge that usually extends past the outer edge of bit storage section 70 of gate 29 that is the closest to transistor 17. Another outer edge on the other side of gate 32 usually extends past the outer edge of section 70 of gate 29 that is the closest to transistor 18. In the preferred embodiment, these outer edges of gate 32 are positioned to extend a distance 33 past the outer edge of section 70 of floating gate 29 so that gate 32 overlies section 70 of gate 29 and preferably extends past the outer edges of section 70 by at least distance 33. In the preferred embodiment, the other two outer edges of gate 32 (the two that are opposite to transistors 17 and 18) are also positioned to extend distance 33 past the outer edge of section 70 so that all of gate 32 overlies all of section 70 by at least distance 33.

Referring again back to FIG. 1, another dielectric layer 34 usually is formed to cover control gate 32 and the first conductor interconnect layer in order to provide insulation from other elements of device 10. In some embodiments a second conductor interconnect layer (not shown) may be formed on the surface of layer 34 to make electrical contact through layer 31 to portions of the underlying first conductor interconnect layer or to other portions of transistors 17 and 18. This second conductor interconnect layer generally is formed from a metal and is often referred to as metal two (2). Such conductor interconnect layers are well known to those skilled in the art. In some embodiments a third conductor interconnect layer (not shown) may be formed on the surface of layer 34. In such embodiments, another optional dielectric layer (not shown) may be formed to cover the third conductor interconnect layer to provide insulation from other elements of device 10. In other embodiments, layer 36 may be omitted.

Subsequently, a metal shield layer or metal layer 39 is formed to include a plurality of openings 45 through layer 39. Layer 39 is formed on layer 34 (or optionally on the optional dielectric layer) so that opening 45 is positioned to overlie a first portion of floating gate 29, thus, each of cells 11-13 includes an opening 45. In the preferred embodiment, outer edges 47 of opening 45 are positioned to extend a distance past the outer edges of section 70 of floating gate 29 so that opening 45 overlies section 70 and so that layer 39 does not overlie section 70 of gate 29. In the preferred embodiment, outer edges 47 are also positioned to extend to overlie gate 32 by a distance 41 from the exterior edge of gate 32 so that a portion of layer 39 does overlie a first portion of gate 32 by distance 41 beyond the outer edge of gate 32. Therefore, opening 45 overlies a second portion of gate 32, such as the portion of gate 32 that overlies section 70. Thus, it can be seen that edges 47 of opening 45 is spaced a third distance past the outer edge of section 70.

Those skilled in the art will appreciate that the area of section 70 is selected to provide a charge storage capacity in dielectric 28 that is sufficient to facilitate transistors 17 and 18 providing a reliable read out of the voltage. Since gate 32 is used during the programming process, some charge may also be stored in the portion of dielectric 29 underlying gate 32 and electrodes 71 and 72. However, the potion of electrodes 71 and 72 that underlie gate 32 is very small so that section 70 effectively functions as the bit storage section for each of cells 11, 12, and 13.

Layer 39 functions as a shield for both electromagnetic interference (EMI) and for exposure to visible and ultraviolet light. Those skilled in the art will appreciate that the metal of layer 39 functions as a shield that terminates electromagnetic waves thereby minimizing the influence on device 10. Additionally, control gate 32 also functions as an EMI shield. During read-out operations, a low potential such as a common potential or ground potential is applied to gate 32. During programming operations, a high potential is applied to gate 32. Because of the electric potentials applied to gate 32 (either high or low), gate 32 functions as an EMI shield for any electromagnetic field that propagate through opening 45. Thus, layer 39 and gate 32 provide EMI protection for device 10.

During operation, device 10 may also be exposed to visible or ultraviolet light. The photonic energy from the light could form an electric potential on gates 29 and 32. The metal of layer 39 shields device 10 from these photons. Because of the potentials applied to gate 32, gate 32 also functions as a shield to prevent the photons from affecting gate 29 thereby preventing the photons from affecting the operation of device 10. Distance 41 is selected to minimize any light from diffracting around the edge of opening 45 and affecting the charges stored below bit storage section 70. In addition, distance 33 is selected to minimize any light from diffracting around the edges of gate 32 and affecting the charges stored below bit storage section 70. Preferably, distances 33 and 41 are no less than the wavelength of visible light or ultraviolet light to which device 10 will be exposed.

During the process of forming device 10, dangling bonds typically are formed on gates 29 and 32. These dangling bonds form a voltage potential that could affect the threshold of transistors 17 and 18 and causes improper operation of transistors 17 and 18. In order to minimize the effect of these dangling bonds, an annealing operation is performed that minimizes the number of dangling bonds. This repair is assisted by the diffusion of gasses (used during the annealing operation) through opening 45. Without opening 45, the metal of layer 39 would prevent this diffusion process and impair the removal of the dangling bonds. Thus, opening 45 provides a structure that assists in forming transistors 17 and 18 with more closely matched threshold voltages. Consequently, one skilled in the art will appreciate that in other embodiments having opening 45 overlie a small portion of section 70 will assist in the annealing process. Thus, in other embodiments edges 47 can extend to overlie portions of section 70 and still provide an advantage. Accordingly, opening 45 can be formed to overlie at least a portion of section 70 and may overlie only twenty percent of the surface area of section 70 and still provide an advantage.

One skilled in the art will appreciate that if distance 41 is sufficient to prevent light from affecting the operation of device 10, then distance 33 may be reduced and in some cases may be zero (0). However, it is preferable for opening 45 to completely overlie at least a portion of gate 29 (such as section 70) in order to provide a means to reduce the dangling bonds and to facilitate an efficient annealing operation.

Subsequently, a passivation layer (not shown) usually is applied to cover layer 39. In some embodiments, a potting material or gel coat or other similar material (not shown) may be applied on top of the passivation layer. Such passivation layers and gel coats are well known to those skilled in the art.

Those skilled in the art will appreciate that cells 11, 12, and 13 typically include other elements that are not shown in FIG. 1-FIG. 3 for the clarity of the drawings. For example, cells 11, 12, and 13 generally include word and bit lines that are used for programming and reading information from the cells. These word and bit lines typically are formed using the conductor interconnect layers described hereinbefore.

From all of the proceeding explanations, one skilled in the art will understand that cell 11 includes: a semiconductor substrate having a channel region of a first transistor formed thereon; a floating gate having a bit storage section and also having a gate electrode overlying a portion of the channel region, the bit storage section having an outer edge; a control gate overlying the floating gate, the control gate having an outer edge that extends a first distance past the outer edge of the bit storage section of the floating gate; a metal layer overlying a first portion of the control gate and extending to overlap the first portion of the control gate by a second distance beyond the outer edge of the control gate; and an opening through the metal layer, the opening overlying the bit storage section wherein an outer edge of the opening is spaced a third distance past the outer edge of the bit storage section and wherein the opening overlies a second portion of the control gate.

From descriptions provided hereinbefore, one skilled in the art will understand that a method of forming cell 11 of device 10 includes: providing a semiconductor substrate; forming a channel region of a first MOS transistor on the semiconductor substrate; forming a floating gate having a it storage section and also having a gate electrode overlying at least a portion of the channel region; forming a control gate overlying the bit storage section; forming a metal layer overlying the control gate; and forming an opening through the metal layer wherein the opening overlies the at least a portion of the bit storage section and also overlies a first portion of the control gate and wherein the metal layer overlies a second portion of the control gate.

In addition, one skilled in the art will understand that the previous explanations hereinbefore include a method of forming cell 11 of device 10 that includes: providing a semiconductor substrate; forming a channel region of a first MOS transistor on the semiconductor substrate; forming a floating gate having a gate electrode overlying at least a portion of the channel region of the first MOS transistor including forming a bit storage section of the floating to have an outer edge; forming a control gate overlying the at least a portion of floating gate; and forming a metal layer having an opening through the metal layer including forming the metal layer to overlie a first portion of the control gate and forming the opening to overlie a second portion of the control gate and to overlie at least a portion of the bit storage section.

In view of all of the above, it is evident that a novel device and method is disclosed. Included, among other features, is forming an EEPROM cell by forming a metal layer having an opening through the metal layer including forming the metal layer to overlie a first portion of the control gate and forming the opening to overlie a portion of the floating gate and a second portion of the control gate. As indicated hereinbefore, having the opening overlying the portion of the floating gate facilitates more accurately forming the threshold voltage of at least one transistor of the EEPROM cell. A further advantage of the opening is improving the manufacturability of the EEPROM device. Those skilled in the art will appreciate that a large metal layer can affect the etch rate of element near the metal layer is slower than the etch rate of element not near the metal layer (such as elements in or near a scribe grid of a wafer on which the EEPROM cell is formed). As a consequence etching time may have to be increased which can lead to undercutting of the metal layer or other elements and to various well known problems. Opening 45 presents a more balanced etch profile that improves the etching operations, thereby improving the manufacturability of the EEPROM cell and the device that includes the EEPROM cell.

While the subject matter of the invention is described with specific preferred embodiments, it is evident that many alternatives and variations will be apparent to those skilled in the semiconductor arts. For example, although cells 11, 12, and 13 are illustrated to have two transistors, in other embodiments cells 11, 12, and 13 may only have one transistor and may or may not have a programming or control transistor. In such a case, the gate electrode of floating gate 29 may only overlie the channel region of the one transistor but not the channel region of the control transistor. Although device 10 is illustrated as having three EEPROM cells, 11, 12, and 13, other embodiments of device 10 may have more or fewer EEPROM cells. As will be appreciated by those skilled in the art, the exemplary form of substrate 16, and doped regions 21, 22, 23, 15, and 26 are used as a vehicle to explain device 10 and that other embodiments are possible. For example, in other embodiments an epitaxial layer may be formed on substrate 16 and regions 21, 22, 23, 15, and 26 may be formed in the epitaxial layer. The conductivity type of the epitaxial layer may be the same as or opposite to that of substrate 16. For the case of opposite conductivity, regions 21, 22, 23, 15, and 26 generally would have a conductivity that is opposite to that explained hereinbefore for device 10. In another embodiment, the outer edge of control gate 32 may extend a large distance past the outer edge of floating gate 29 and may be adjacent to or may even extend to overlap a portion of the channel region of one or more of transistors 17, 18, 60, 61, 66, or 67. Additionally, the word "connected" is used throughout for clarity of the description, however, it is intended to have the same meaning as the word "coupled". Accordingly, "connected" should be interpreted as including either a direct connection or an indirect connection.

The invention claimed is:

1. A method of forming an EEPROM cell of a semiconductor device comprising:
   providing a semiconductor substrate;
   forming a channel region of a first MOS transistor on the semiconductor substrate;
   forming a floating gate having a bit storage section and also having a gate electrode overlying at least a portion of the channel region;
   forming a control gate overlying the bit storage section;
   forming a metal layer overlying the control gate; and
   forming an opening through the metal layer wherein the opening overlies the at least a portion of the bit storage section and also overlies a first portion of the control gate and wherein the metal layer overlies a second portion of the control gate.

2. The method of claim 1 wherein forming the metal layer overlying the control gate includes forming the metal layer to overlie all of the EEPROM cell that is not underlying the opening.

3. The method of claim 1 wherein forming the opening includes forming the opening to extend past an outer edge of the bit storage section but not beyond an outer edge of the control gate.

4. The method of claim 3 wherein forming the opening to extend past the outer edge of the bit storage section but not beyond the outer edge of the control gate includes forming the opening so that the metal layer overlaps the control gate a distance that is no less than a wavelength of visible light.

5. The method of claim 1 wherein forming the control gate overlying the bit storage section includes forming the control gate to extend a first distance beyond an outer edge of the bit storage section.

6. The method of claim 5 further including forming the first distance to be no less than a wavelength of visible light.

7. The method of claim 1 wherein forming the opening includes forming the opening to overlie at least twenty percent of the surface area of the bit storage section.

8. A method of forming an EEPROM cell of a semiconductor device comprising:
   providing a semiconductor substrate;
   forming a channel region of a first MOS transistor on the semiconductor substrate;
   forming a floating gate having a gate electrode overlying at least a portion of the channel region of the first MOS transistor including forming a bit storage section of the floating to have an outer edge;
   forming a control gate overlying the at least a portion of the floating gate; and
   forming a metal layer having an opening through the metal layer including forming the metal layer to overlie a first portion of the control gate and forming the opening to overlie a second portion of the control gate and to overlie at least a portion of the bit storage section.

9. The method of claim 8 wherein forming the metal layer having the opening includes forming the opening to overlie the second portion of the control gate with the metal layer overlapping the control gate by at least a wavelength of light.

10. The method of claim 8 wherein forming the control gate overlying at least the portion of the floating gate includes forming the control gate to extend a distance past an outer edge of the bit storage section.

11. The method of claim 10 wherein forming the control gate to extend the distance past the outer edge of the bit storage section includes forming the control gate to extend a distance that is no less than a wavelength of light past an outer edge of the bit storage section.

12. The method of claim 10 wherein forming the control gate to extend the distance includes forming the distance to be no less than a wavelength of visible light or ultraviolet light.

13. The method of claim 8 further including forming a channel region of a second MOS transistor on the semiconductor substrate and forming another gate electrode of the floating gate to overlie at least a portion of the channel region of the second MOS transistor.

* * * * *